United States Patent
Tsubouchi et al.

(10) Patent No.: US 8,461,900 B2
(45) Date of Patent: Jun. 11, 2013

(54) FREQUENCY CONVERTING CIRCUIT, SIGNAL PROCESSING CIRCUIT AND RECEIVER

(75) Inventors: Yuta Tsubouchi, Kanagawa-ken (JP); Toshiya Mitomo, Kanagawa-ken (JP); Tong Wang, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 58 days.

(21) Appl. No.: 13/176,189

(22) Filed: Jul. 5, 2011

(65) Prior Publication Data

US 2012/0001667 A1    Jan. 5, 2012

(30) Foreign Application Priority Data

Jul. 5, 2010    (JP) ................................. 2010-153151

(51) Int. Cl.
*H04B 1/26* (2006.01)

(52) U.S. Cl.
USPC .......................................... 327/355; 455/323

(58) Field of Classification Search
USPC ........................... 327/355–361; 455/323, 326
See application file for complete search history.

(56) References Cited

U.S. PATENT DOCUMENTS

| | | | |
|---|---|---|---|
| 6,748,204 B1 | 6/2004 | Razavi et al. | |
| 7,514,981 B2 * | 4/2009 | Yang et al. | 327/359 |
| 7,899,426 B2 * | 3/2011 | Tasic et al. | 455/286 |
| 8,089,309 B2 * | 1/2012 | Jansen et al. | 327/359 |
| 2005/0124311 A1 * | 6/2005 | Mahmoudi et al. | 455/323 |

* cited by examiner

*Primary Examiner* — Dinh T. Le
(74) *Attorney, Agent, or Firm* — Nixon & Vanderhye, P.C.

(57) ABSTRACT

An example frequency converting circuit generates a multiplied signal obtained by multiplying a local signal by an amplified signal generated by an amplifying portion. The frequency converting circuit includes a converter which converts the amplified signal into a current signal and a switching circuit which multiplies the current signal by the local signal and generates the multiplied signal. An impedance element supplies a first direct current from the amplifier and a second direct current from the switching circuit to the converter.

14 Claims, 12 Drawing Sheets

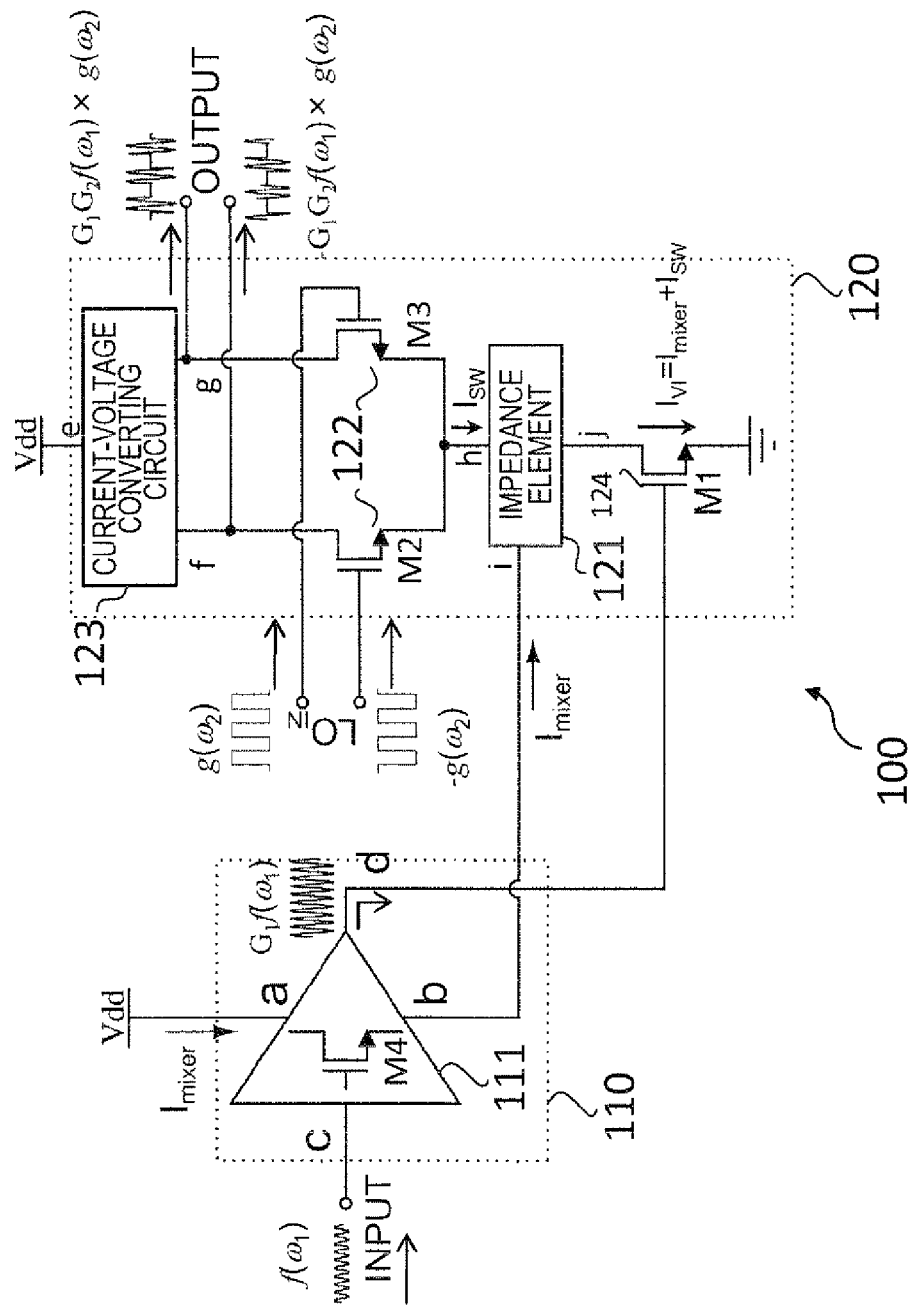

FREQUENCY CONVERTING CIRCUIT, SIGNAL PROCESSING CIRCUIT AND RECEIVER

CROSS-REFERENCE TO RELATED APPLICATION

The present invention claims the benefit of the priority application of Japanese Patent Application No. 2010-153151, filed on Jul. 5, 2010. This application is hereby incorporated by reference in its entirety.

FIELD

One embodiment relates to a frequency converting circuit, a signal processing circuit and a receiver.

BACKGROUND

When the amplitude of an input signal is small, the frequency converter is susceptible to the influence of noise and has a problem that it is not possible to correctly convert the frequency of the input signal.

Conventionally known frequency converters additionally input a current in a voltage-current converter to provide the difference between the amount of a direct current which flows into a switching step and the amount of a current which flows into the voltage-current converter. Consequently, it is possible to reduce noise that is produced in the switching step and to operate the switching step even with a local signal having small amplitude.

However, the conventional frequency converters additionally supply the current to the voltage-current converter, and therefore increase power consumption.

Therefore the present invention provides a frequency converting circuit, a signal processing circuit and a receiver which can convert the frequency even if the amplitude of a local signal is small and which can suppress an increase of power consumption.

BRIEF DESCRIPTION OF THE DRAWINGS

FIG. 1A is a view illustrating a signal processing circuit according to a first embodiment;

DETAILED DESCRIPTION

Figure 1B:
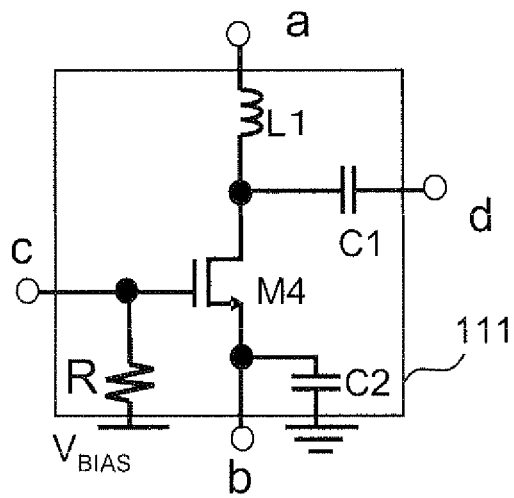
FIG. 1B is a circuit diagram illustrating an example of an amplifier according to the first embodiment.

According to one embodiment, a frequency converting circuit which generates a multiplied signal obtained by multiplying a local signal by an amplified signal generated by an amplifying portion comprising a first transistor having a drain terminal connected to a first power source potential, the frequency converting circuit comprising: a converter which comprises a second transistor of which gate terminal is connected to the amplifying portion and which converts the amplified signal inputted to the gate terminal into a current signal; a switching circuit which comprises two third-transistors of which a source terminal is connected each other and which multiplies the current signal by the local signal and generates the multiplied signal; and an impedance element which comprises a first terminal connected to a source terminal of the first transistor, a second terminal connected to a drain terminal of the second transistor and a third terminal connected to the source terminal of the third transistor, which inputs a first direct current inputted from the source terminal of the first transistor and a second direct current inputted from the source terminal of the third transistor into the drain terminal of the second transistor, of which impedance is an ACwise high impedance between the first terminal and the second terminal.

Hereinafter, embodiments of the present invention will be described with reference to the drawings. In each drawing, the same components are designated by the same reference numerals, and descriptions thereof will not be repeated.

<First Embodiment>

FIG. 1A is a circuit diagram of a signal processing circuit 100 according to the first embodiment. The signal processing circuit 100 illustrated in FIG. 1A has an amplifying portion 110 which outputs an amplified signal obtained by amplifying an input signal, and a frequency converting circuit 120 which outputs a multiplied voltage signal obtained by converting the frequency of the amplified signal.

The amplifying portion 110 has an amplifier 111. FIG. 1B is a circuit diagram illustrating an example of the amplifier 111. The amplifier 111 has a transistor M4. A drain terminal of the transistor M4 is connected to a first terminal which has a first power source potential (Vdd) through an inductance element L1. A source terminal of the transistor M4 is connected to a second terminal b. The source terminal of the transistor M4 and second terminal b are DCwise short-circuited. Further, the source terminal of the transistor M4 is connected to a ground through a capacitor C2, and is thereby ACwise grounded. The gate terminal of the transistor M4 is connected to a third terminal c. Between the gate terminal of the transistor M4 and third terminal c, a resistance R is provided having one end connected to the third terminal c and gate terminal of the transistor M4 and the other end applied to a bias voltage $V_{BIAS}$. Further, the drain terminal of the transistor M4 is connected to a fourth terminal d through the capacitor C1 provided between the inductance element L1 and drain terminal of the transistor M4.

Currents flowing into the amplifier 111 will be described in terms of a direct current and alternating current, respectively.

First, the alternating current flowing into the amplifier 111 will be described.

The amplifier 111 amplifies an input signal $f(\omega_1)$ which is an alternating current signal, and generates an amplified signal $G_1 f(\omega_1)$ which is an alternating current signal. The amplifier 111 amplifies the input signal $f(\omega_1)$ inputted from the third terminal c to generate the amplified signal $G_1 f(\omega_1)$, and outputs the amplified signal from the fourth terminal d. Here, $G_1$ is gain of the amplifier 111. The amplified signal $G_1 f(\omega_1)$ outputted from the fourth terminal d is inputted in the frequency converting circuit 120.

Next, the direct current flowing into the amplifier 111 will be described.

The amplifier 111 receives an input of a direct current $I_{mixer}$ required to drive the amplifier 111 at the first terminal a, and outputs the direct current from the second terminal b. The direct current $I_{mixer}$ outputted from the second terminal b is inputted to the frequency converting circuit 120.

Referring back to FIG. 1A, the frequency converting circuit 120 has a converter 124, an impedance element 121, a switching circuit 122 and a current-voltage converting circuit 123.

The converter 124 is a circuit which converts the inputted amplified signal $G_1 f(\omega_1)$ from the voltage into the current, and generates a current signal. Hence, the converter 124 will also be referred to as "voltage-current converter 124" hereafter.

The voltage-current converter 124 has a transistor M1. A gate terminal of the transistor M1 is connected to the fourth terminal d of the amplifier 111. A source terminal of the transistor M1 is grounded, and the drain terminal is connected to a terminal j of the impedance element 121.

The impedance element 121 has a terminal i connected to the terminal b of the amplifier 111, a terminal h connected to the switching circuit 122 and the terminal j connected to the voltage-current converter 124. The impedance element 121 provides a high AC impedance and provides a low DC impedance between the terminals h and i and between the terminals i and j. That is, the impedance element 121 connects the source terminal of the amplifier 111 and frequency converting circuit 120 with a high AC impedance and low DC impedance. With this connection, the current Imixer used to drive the amplifier 111 of the amplifying portion 110 is supplied to the voltage-current converter 124 of the frequency converting circuit 120 through the impedance element 121.

By contrast, a high AC impedance is provided between the terminals h and i and between the terminals i and j, and therefore an alternating current signal (for example, the above-mentioned current signal) which is an alternating current signal flowing into the frequency converting circuit 120 and which flows between the terminals h and j is prevented from flowing outside the frequency converting circuit 120 (amplifier 111) through the terminal i. Further, the alternating current signal is also prevented from flowing into the frequency converting circuit 120 from outside (amplifier 111) through the terminal i. The AC and DC impedances are both low between the terminals h and j. That is, the impedance element 121 connects the switching circuit 122 and voltage-current converter 124 with both low AC and DC impedances.

Further, when seen from the terminal i, the impedance element 121 operates as if the impedance element 121 is ACwise grounded. That is, when seen from the source terminal of the transistor M4 of the amplifier 111, the impedance element 121 is ACwise grounded. With this connection, it is possible to adjust the source terminal of the transistor M4 of the amplifier 111 to a constant potential (ground in the present embodiment), and keep the constant potential between the drain terminal and source terminal of the transistor M4 of the amplifier 111.

Figure 1D:
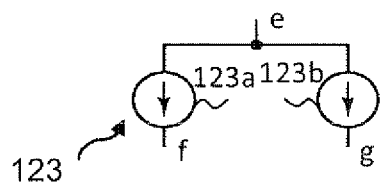
FIG. 1D is a view illustrating an example of a current-voltage converting circuit.
Figure 1C:
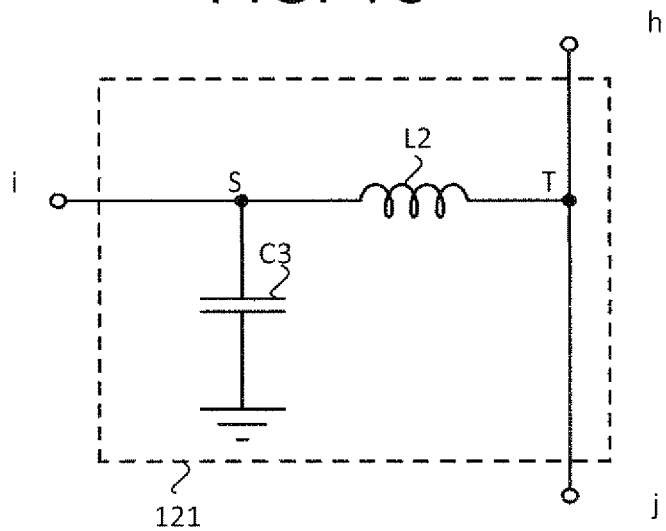
FIG. 1C is a view illustrating an example of an impedance element according to the first embodiment.

FIG. 1C is a circuit diagram illustrating an example of the impedance element 121. The terminals h, i and j in FIG. 1C respectively correspond to the terminals h, i and j in FIG. 1A.

The impedance element 121 illustrated in FIG. 1C has an inductance element L2 having one end connected to the terminal i and having the other end connected to the terminal h and terminal j, and a capacitor C3 having the one end connected to the terminal i and having the other end grounded.

That is, the impedance element 121 in FIG. 1C directly connects the switching element 122 and voltage-current converter 124, and connects the amplifying portion 110 and switching circuit 122, and the switching circuit 122 and voltage-current converter 124 through the inductance element L2. By this means, it is possible to provide both low AC and DC impedances between the terminals h and j, and provide a high AC impedance and a low DC impedance between the terminals i and j.

Further, the terminal i is grounded through the capacitor C3. The capacitor C3 has a low AC impedance and high DC impedance. Thus, the terminal i is AC grounded.

The switching circuit 122 has two transistors M2 and M3, and outputs a multiplied signal by multiplying an amplified signal with a local signal (alternating current signal). As described later, the switching circuit 122 performs a switching operation of passing or blocking the current according to the magnitude of the given local signal.

The two transistors M2 and M3 of the switching circuit 122 are aligned in parallel. The gate terminals of the transistors M2 and M3 receive local signals $-g(\omega_2)$ and $g(\omega_2)$, respectively. The source terminals of the transistors M2 and M3 are connected to the terminal h of the impedance element 121. The drain terminals of the transistors M2 and M3 are connected to terminals f and g of the current-voltage converting circuit 123, respectively.

The current-voltage converting circuit 123 converts the multiplied signal (current) outputted from the switching circuit 122 into the voltage, and outputs the multiplied voltage signal. The terminal e of the current-voltage converting circuit 123 is connected to the first power source potential (Vdd). The multiplied voltage signals are outputted from the terminal f and terminal g of the current-voltage converting circuit 123.

FIG. 1D illustrates an example of the current-voltage converting circuit 123. The current-voltage converting circuit 123 in FIG. 1D has current sources 123a and 123b. Both of the current sources 123a and 123b have one ends connected to the terminal e. The other end of the current source 123a is connected to the terminal f. The other end of the current source 123b is connected to the terminal g. The terminals e, f and g respectively correspond to the terminals e, f and g in FIG. 1A.

Next, signals flowing into the frequency converting circuit 120 will be described in terms of a direct current signal and alternating current signal using FIG. 1A.

First, the alternating current signal flowing into the frequency converting circuit 120 will be described.

The amplified signal $G_1 f(\omega_1)$ amplified by the amplifying portion 110 is inputted to the voltage-current converter 124. The voltage-current converter 124 converts the amplified signal $G_1 f(\omega_1)$ into the current signal $G_{M1} G_1 f(\omega_1)$. Here, $G_{M1}$ is a conversion gain of the transistor M1 (voltage-current converter 124). The current signal $G_{M1}G_1 f(\omega_1)$ is inputted in the switching circuit 122 through the impedance element 121. The transistors M2 and M3 of the switching circuit 122 pass the inputted current signal $G_1 f(\omega)$ between the drain and source when the potentials of the gate given from the respective local signals $-g(\omega_2)$ and $g(\omega_2)$ are high.

By contrast, the transistors M2 and M3 block the current between the drain and source when the potentials of the gate are low. By this means, the current signal $G_{M1}G_1 f(\omega)$ is multiplied by local signals $g(\omega_2)$ and $-g(\omega_2)$ to generate a multiplied signal. The multiplied signal outputted from the switching circuit 122 is converted into a multiplied voltage signal by the current-voltage converting circuit 123. The multiplied voltage signal which is the final output signal of the frequency converting circuit 120 is represented by $2G_1G_2 f(\omega_1) \times g(\omega_2)$ $(=G_1G_2 f(\omega_1) \times g(\omega_2) - [-G_1G_2 f(\omega_1) \times g(\omega_2)])$. $G_2$ is the final frequency conversion gain of the frequency converting circuit 120.

The above-described amplified signal, current signal, local signal, multiplied signal, and multiplied voltage signal are all alternating current signals. In this way, the alternating current amplified signal inputted in the frequency converting circuit 120 is multiplied by the local signal and the resultant is outputted.

Next, a direct current flowing into the frequency converting circuit 120 will be described.

Direct currents flow into the transistors M2 and M3 of the switching circuit 122, respectively. The amount of the direct current flowing into one of these transistors M2 and M3 are represented by $½*I_{SW}$. That is, the total amount of the direct currents flowing into the switching circuit 122 is represented by $I_{SW}$.

This direct current $I_{SW}$ is also inputted in the voltage-current converter 124 connected in series through the impedance element 121. In the voltage-current converter 124, the direct current $I_{mixer}$ consumed to drive the amplifier 111 further flows through the impedance element 121. Hence, the direct current flowing into the voltage-current converter 124 is represented by $I_{SW}+I_{mixer}$.

Thus, the direct current flowing into the voltage-current converter 124 is greater, by the amount of the direct current $I_{mixer}$ inputted from the amplifier 111, than the direct current flowing in the switching circuit 122. Thus, providing the difference between the total amounts of direct currents flowing into the voltage-current converter 124 is preferable for circuit characteristics of a frequency converting circuit. This reason will be described using FIG. 1A.

In many cases, the voltage-current converter 124 is required to linearly convert the amplified signal $G f(\omega)$ which is an inputted voltage signal into a current signal. Therefore, there is a desired value of a direct current applied in advance between the drain and source of the transistor M1 of the voltage-current converter 124. By contrast, the direct currents to be applied between the drains and sources of the transistors M2 and M3 of the switching circuit 122 are preferably smaller than the desired value of the voltage-current converter 124. When the direct current flowing into the switching circuit 122 is small, the demand for the voltage amplitude of the local signal g is relaxed and a desired switching operation can be realized even if the amplitude is small. It is also possible to suppress thermal noise caused by the direct currents flowing between the drains and sources of the transistors M2 and M3 of the switching circuit 122.

By causing the total amount of the direct current flowing between the drain and source of the transistor M1 of the voltage-current converter 124 to be larger than the total amount of the direct currents flowing between the drains and sources of the transistors M2 and M3 of the switching circuit 122, it is possible not only to adjust to a desired value the direct current flowing between the drain and source of the transistor M1 of the voltage-current converter 124, but also to reduce the direct currents flowing between the drain and source of the transistors M2 and M3 of the switching circuit 122.

Consequently, by causing the total amount of the direct current flowing between the drain and source of the transistor M1 of the voltage-current converter 124 to be larger than the total amount of the direct currents flowing between the drains and sources of the transistors M2 and M3 of the switching circuit 122, it is possible not only to perform linear conversion in the voltage-current converter 124, but also to reduce the amplitude of the local signal of the switching circuit 122 and suppress noise. That is, the characteristics of the entire frequency conversion circuit 120 are improved.

With the present embodiment, by supplying the direct current $I_{mixer}$ used to drive the amplifying portion 110 to the voltage-current converter 124 through the impedance element 121, the difference corresponding to $I_{mixer}$ is provided between the total amount of the direct current flowing between the drain and source of the transistor M1 of the voltage-current converter 124 and the total amount of the direct current flowing between the drains and sources in the switching circuit 122. That is, the current which is used to drive the amplifier 111 is applied to improve characteristics of the frequency converting circuit 120. By so doing, it is possible to improve the characteristics of the frequency converting circuit 120 without providing an additional current source in the frequency converting circuit 120.

As described above, the frequency converting circuit and signal processing circuit of the present embodiment can provide a frequency converting circuit which can convert the frequency even if the amplitude of a local signal is small and can suppress an increase of power consumption. Further, the frequency converting circuit and signal processing circuit can improve the conversion gain and noise characteristics at the same time.

In addition, although the terminal i is configured to be grounded through the capacitor C3 having a low AC impedance with the present embodiment, the terminal i does not need to be grounded. The terminal b of the amplifying portion only needs to be connected to a portion having a constant potential (no fluctuation in the potential) through an element having a low AC impedance. That is, for example, the terminal b only needs to be AC grounded.

<Second Embodiment>

Figure 2A:
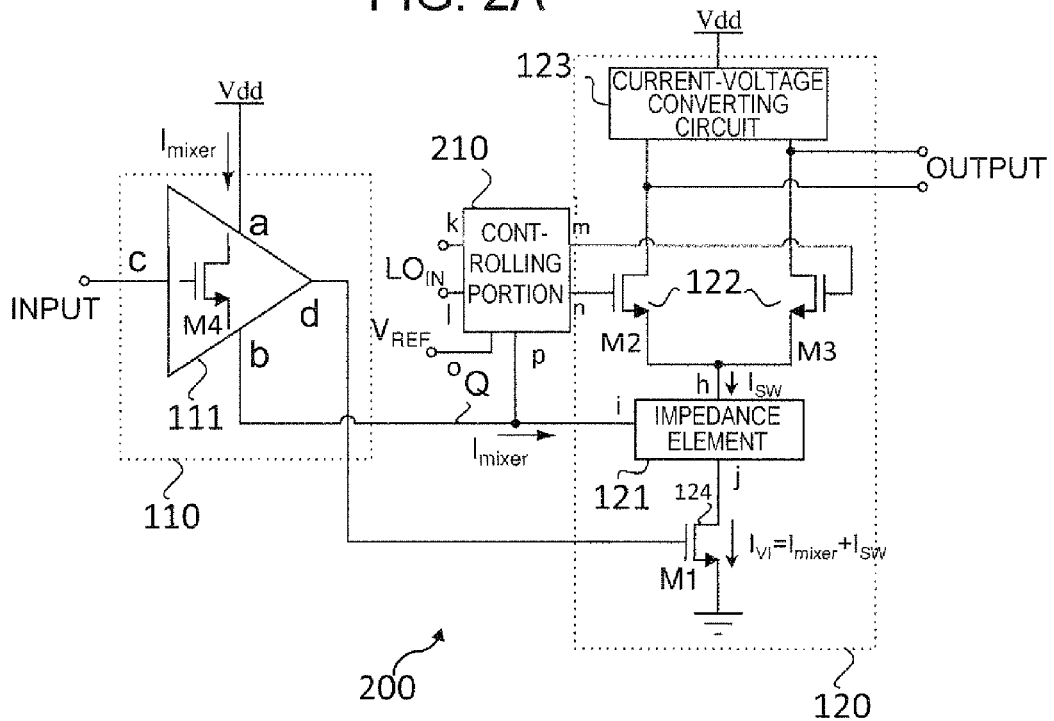
FIG. 2A is a view illustrating a signal processing circuit according to a second embodiment.

Next, signal processing circuit 200 according to a second embodiment of the present invention will be described. FIG. 2A is a circuit diagram of the signal processing circuit 200 according to the second embodiment. The signal processing circuit 200 employs a configuration in which a controlling portion 210 is further added to the signal processing circuit according to the first embodiment. The other configurations are the same as those in FIG. 1. In addition, although the controlling portion 210 is configured to be provided outside the frequency converting circuit 120, the controlling portion 210 may be configured to be provided inside the frequency converting circuit 120.

The controlling portion 210 has terminals k and l which receive inputs of local signals alternating current signals). The controlling portion 210 has a terminal o which receives an input of a reference voltage $V_{REF}$ (direct current signal) which is given from the outside. The controlling portion 210 has a terminal m and a terminal n which output the inputted local signals as they are.

The controlling portion 210 monitors the first potential through the terminal p connected to, for example, a connecting portion Q between the terminal b of the amplifier 111 and the terminal i of the impedance element 121. The controlling portion 210 compares the reference voltage $V_{REF}$ and the first potential of the connecting portion Q, and superimposes the direct current voltages from the terminals m and n on a local signal such that the first potential of the connecting portion Q and the reference voltage match, and outputs the direct voltages. That is, the controlling portion 210 inputs the signal, that is obtained by superimposing the local signal and direct current voltage, to the transistor M3 through the terminal m and to the transistor M2 through the terminal n. The reference voltage is a potential required to cause the amplifier 111 to perform a desired operation such as linear amplification at a desired amplification factor, and is determined in advance. The reference voltage is designed such that the rate of the magnitude of the direct current flowing into the voltage-current converter 124 to the magnitude of the direct current flowing into the switching current 122 becomes a desired value.

The direct current voltage outputted from the controlling portion 210 adjusts the total amount $I_{SW}$ of the direct current flowing into the switching circuit 122 by controlling the voltages of the respective gate terminals of the transistor M2 and M3 of the switching circuit 122. The controlling portion 210 controls the current flowing into the voltage-current converter 124 by adjusting the direct current $I_{SW}$. Further, the controlling portion 210 controls the first potential of the connecting portion Q by adjusting the direct current $I_{SW}$. Hereinafter, the reason why the first potential of the connecting portion Q can be controlled by adjusting the direct current $I_{SW}$ by the controlling portion 210 will be described.

The voltage-current converter 124 receives an input of a current $I_{VI}$ of the sum of the direct current $I_{SW}$ and the direct current $I_{mixer}$ inputted from the amplifying portion 111. The first potential of the connecting portion Q is determined based on the sum of the voltage drop between the terminals i and j of the impedance element 121 and the voltage drop of the voltage-current converter 124. As described above, the voltage drop between the terminals i and j of the impedance element 121 is DCwise very small. Hence, if the voltage drop between the terminals i and j of the impedance element 121 is neglected, the potential of the connecting portion Q is determined based on the voltage drop of the voltage-current converter 124. The voltage drop of the voltage-current converter 124 is determined based on the characteristics of the transistor M1 and the current $I_{VI}$ flowing into the transistor M1. As described above, the current $I_{VI}$ is represented by $I_{mixer}+I_{SW}$. The direct current $I_{mixer}$ is determined according to the first potential of the connecting portion Q. Although the direct current $I_{mixer}$ cannot be controlled directly, the value of $I_{mixer}$ can be controlled by adjusting $I_{SW}$. Consequently, the current $I_{VI}$ is changed by adjusting the direct current $I_{SW}$. By this means, it is possible to control the first potential of the connecting portion Q.

Further, when the potential of the connecting portion Q is finally determined, the direct current $I_{mixer}$ flowing into the amplifier 111 is determined. When the potential of the connecting portion Q becomes a desired value, the rate of the total amount $I_{SW}$ of the direct current flowing into the switching circuit 122 to the direct current $I_{VI}=I_{SW}+I_{mixer}$ flowing into the voltage-current converter 124 becomes a desired value.

As described above, the operation points of the all circuits are fixed by providing the controlling portion 210. By this means, even if the manufacturing state, environmental temperature and power source voltage of circuits fluctuate, the bias of the switching circuit 122 is automatically adjusted such that the connecting portion Q is kept at a desired potential and the desired direct current $I_{mixer}$ flows into the amplifier 111. Further, by adjusting the direct current voltage inputted to the gate terminals of the transistors M2 and M3, it is possible to determine the current $I_{SW}$ flowing into the switching circuit 122 irrespectively of the sizes of the transistors M2 and M3, the manufacturing state, or the environmental temperature of the circuits.

Next, an example of a detailed configuration of the controlling portion 210 will be described.

Figure 2B:
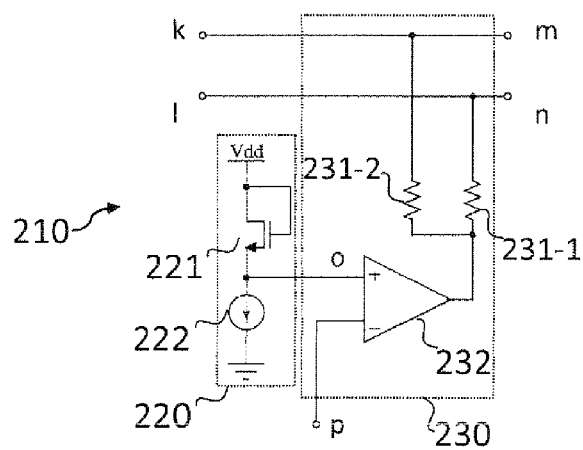
FIG. 2B is a view illustrating an example of a controlling portion.

The controlling portion 210 illustrated in FIG. 2B has a controlling circuit 230 and a reference voltage generating circuit 220. In addition, although the controlling portion 210 employs a configuration including the reference voltage generating circuit 220 in FIG. 2B, the controlling portion 210 may be configured to be provided outside the signal processing circuit 200 as illustrated in FIG. 2A and input the reference voltage in the controlling portion 210.

The reference voltage generating circuit 220 has a MOS transistor 221 and a current source 222, and generates the reference voltage $V_{REF}$. The drain terminal and gate terminal of the MOS transistor 221 are connected to the first power source potential Vdd. The source terminal of the MOS transistor 221 is connected to one end of the current source 222. The other end of the current source 222 is connected to the second power source potential (ground in FIG. 2B). The source terminal of the MOS transistor 221 and one end of the current source 222 are connected to the terminal o of the controlling circuit 230. The reference voltage generating circuit 220 outputs the reference voltage $V_{REF}$ from the source terminal of the MOS transistor 221.

By adjusting the size of the MOS transistor 221 and the condition of the current amount of the current source 222, the reference voltage generating circuit 220 reproduces desired states of the direct current voltages $I_{mixer}$ and $I_{VI}$ of the amplifier 111 and voltage-current converter 124. That is, the reference voltage generating circuit 220 operates as a dummy for the amplifier 111 and voltage-current converter 124. The reference voltage generating circuit 230 outputs the first voltage of the connecting portion Q in FIG. 2 when the amplifier 111 and voltage-current converter 124 are operating in ideal states.

The controlling circuit 230 has resistances 231-1 and 231-2 and a computing amplifier 232. The terminal o of the computing amplifier 232 is connected with the source of the MOS transistor 221 and one end of the current source 222. The terminal p of the computing amplifier 232 is connected to the connecting portion Q in FIG. 2A. The output terminal of the computing amplifier 232 is connected to the terminals k and l and the terminals m and n through the resistances 231-1 and 231-2. In addition, the terminal k and terminal m, and the terminal l and terminal n are short-circuited, respectively.

The terminal o of the computing amplifier 232 receives an input of the reference voltage $V_{REF}$, and the terminal p receives an input of the first voltage of the connecting portion Q in FIG. 2A.

The terminals k and l of the controlling portion 210 receive an input of a local signal from outside. The terminals m and n of the controlling portion 210 output signals obtained by superimposing the direct current voltage outputted from the computing amplifier 232 and local signal.

The controlling portion 210 has a feedback route reaching the terminal p from the terminals m and n through the switching circuit 122 and impedance element 121. When the potential of the connecting portion Q is different from the reference voltage $V_{REF}$, according to the virtual short-circuiting effect of the computing amplifier 232, the direct current voltage levels of the terminals in and n are adjusted such that the potential of the connecting portion Q and the reference voltage $V_{REF}$ become equal, so that the direct current $I_{SW}$ changes and, as a result, the potential of the connecting portion Q becomes a desired value.

The frequency converting circuit 120 and signal processing circuit 200 according to the present embodiment can achieve the same effect as in the first embodiment. That is, the frequency converting circuit 120 and signal processing circuit 200 according to the present embodiment can convert the frequency even if the amplitude of a local signal is small, suppress an increase of power consumption and improve the gain conversion and noise characteristics.

Further, the frequency converting circuit 120 and signal processing circuit 200 according to the present embodiment can adjust to a desired value the first potential at the connecting portion Q which connects the amplifier 111 and the voltage-current converter 124 through the impedance element 121, and operate the amplifier 111 within a desired range (the range where the amplifier 111 linearly operates at a desired amplification factor).

It is possible to perform a control action such that the rate of the magnitude of the direct current $I_{VI}$ flowing into the voltage-current converter 124 to the magnitude of the direct current $I_{SW}$ flowing into the switching circuit 122 becomes a desired value. this means, it is possible to adjust to a desired value of the magnitude of the direct current $I_{VI}$ flowing into the voltage-current converter 124, and reduce the direct current $I_{SW}$ flowing into the switching circuit 122. As a result, the voltage-current converter 124 can linearly convert an amplified signal, which is an inputted voltage signal, into a current signal. In addition, the switching circuit 122 can decrease the voltage amplitude of a local signal and reduce thermal noise of the switching circuit 122 resulting from the direct currents flowing between the source terminals and drain terminals of the transistors M2 and M3 of the switching circuit 122.

<Third Embodiment>

Figure 3:
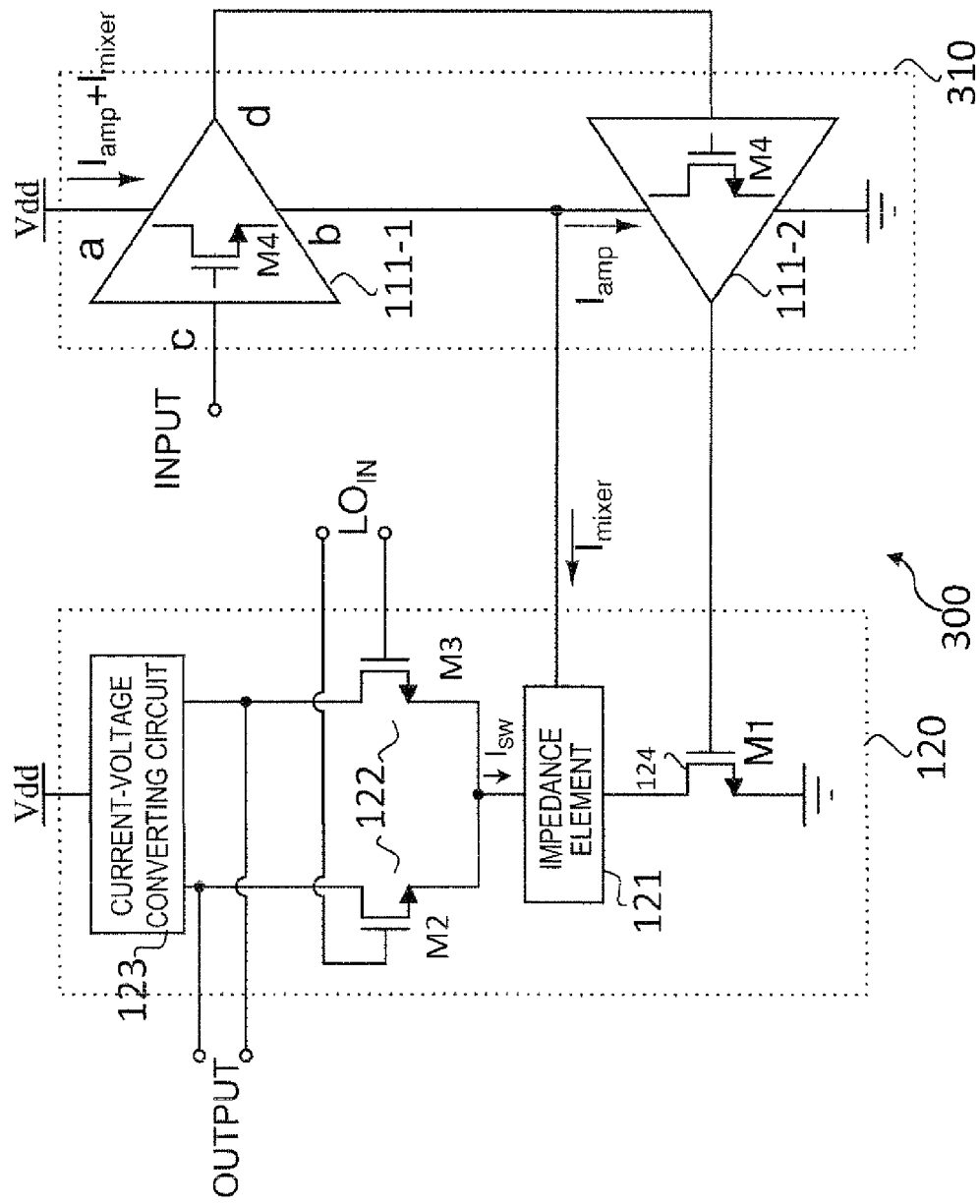
FIG. 3 is a view illustrating a signal processing circuit according to a third embodiment.

Next, a signal processing circuit 300 according to a third embodiment will be described. FIG. 3 is a circuit diagram of the signal processing circuit 300. The signal processing circuit 300 has an amplifying portion 310 and the frequency converting circuit 120. The signal processing circuit 300 differs from the signal processing circuit 100 according to the first embodiment in that the amplifying portion 310 has two amplifiers 111-1 and 111-2.

Each configuration of the amplifiers 111-1 and 111-2 is the same as the configuration of the amplifier 111 described in the first embodiment.

The source terminal of the transistor M4 of the amplifier 111-1 and the drain terminal of the transistor M4 of the amplifier 111-2 are DCwise connected. Further, the source terminal of the amplifier 111-1 and the drain terminal of the amplifier 111-2 are connected to the impedance element 121 of the frequency converting circuit 120.

The drain terminal of the amplifier 111-1 is connected to the first power source potential Vdd, and the source terminal of the amplifier 111-2 is connected to the second power source potential (ground).

The input terminal c of the amplifier 111-1 receives an input of an input signal $f(\omega_1)$ which is an alternating current signal. The output terminal d of the amplifier 111-1 is connected to the input terminal c of the amplifier 111-2. That is, the amplifier 111-1 and amplifier 111-2 are connected in cascade in terms of high frequency small signal processing. The output terminal of the amplifier 111-2 is connected to the gate terminal of the voltage-current converter 124 of the frequency converting circuit 120.

The flow of currents of the direct current and alternating current in the signal processing circuit 300 according to the present embodiment will be respectively described below.

First, an alternating current signal will be described.

The amplifier 111-1 receives an input of the input signal which is an alternating current signal. The input signal is inputted to the input terminal of the amplifier 111-1, is amplified by the amplifier 111-1, and is converted into a first amplified signal. The first amplified signal is inputted to the amplifier 111-2, is amplified by the amplifier 111-2, and is converted into a second amplified signal. The second amplified signal is inputted to the gate terminal of the transistor M1 of the voltage-current converter 124 of the frequency converting circuit 120 as the output signal of an amplifying portion 310.

Next, the direct current signal will be described.

The direct current $I_{amp}+I_{mixer}$ flows between the source terminal and drain terminal of the transistor M4 of the amplifier 111-1. The amplifier 111-1 is driven by the direct current $I_{amp}+I_{mixer}$. $I_{amp}$ of the direct current $I_{amp}+I_{mixer}$ flows between the source terminal and drain terminal of the transistor M4 of the amplifier 111-2. The amplifier 111-2 is driven by $I_{amp}$. The other $I_{mixer}$ of the direct current $I_{amp}+I_{mixer}$ is supplied to the voltage-current converter 124 through the impedance element 121.

As described above, the signal processing circuit 300 reduces power consumption by using the current having been used to drive the amplifier 111-1 to drive the amplifier 111-2 at a later stage. Further, similar to the first embodiment, by applying for the frequency converter 124 the current used to drive the amplifier 111-1, it is possible to provide a circuit which improves performance of a frequency converting circuit without additional power consumption.

<Fourth Embodiment>

Figure 4A:
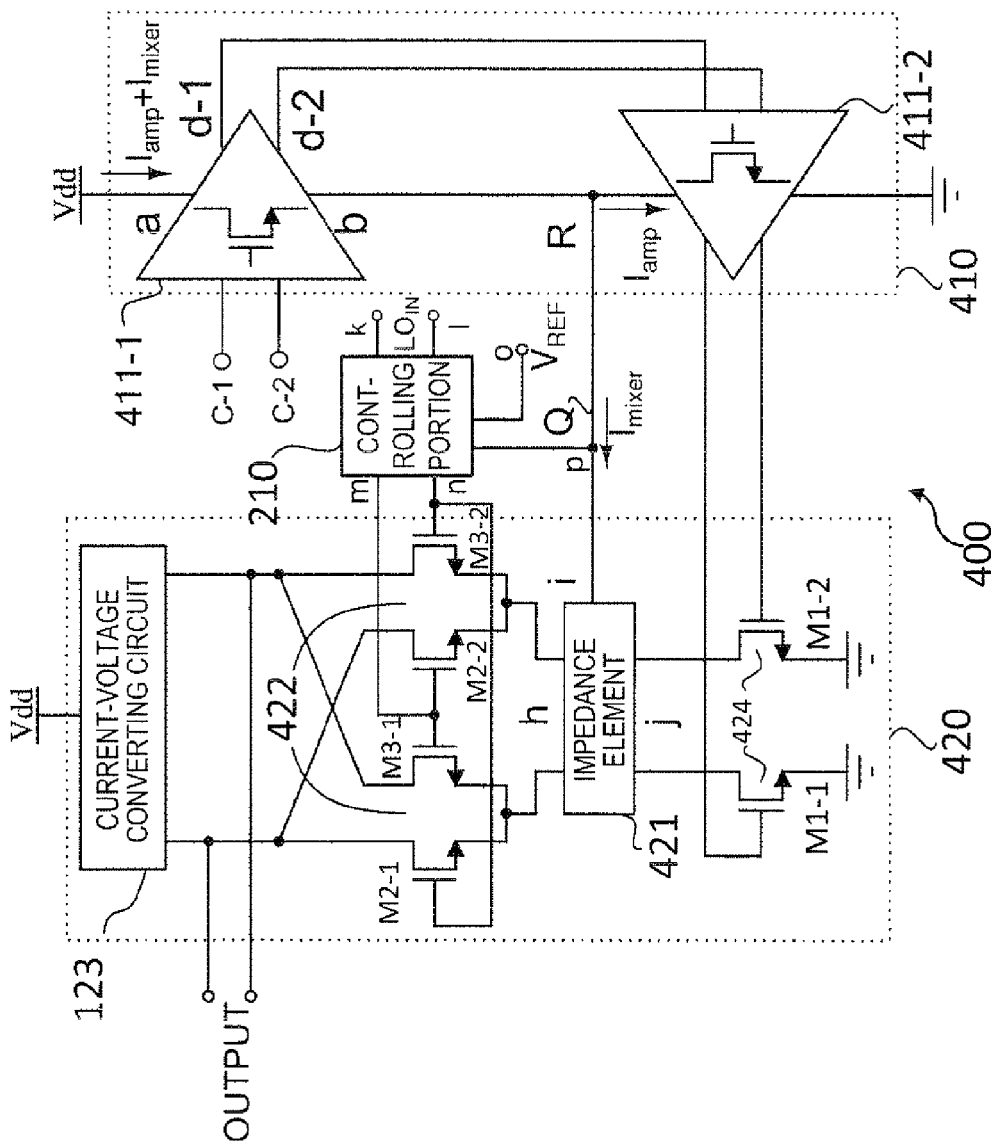
FIG. 4A is a view illustrating a signal processing circuit according to a fourth embodiment.
Figure 4B:
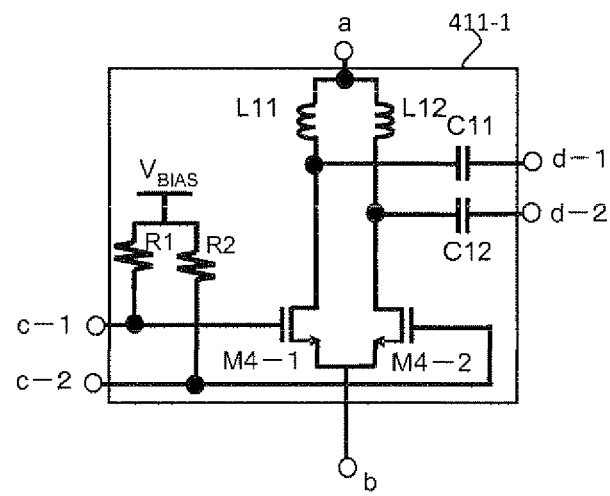
FIG. 4B is a view illustrating an example of an amplifier according to the fourth embodiment.

Next, a signal processing circuit 400 according to the fourth embodiment will be described. FIG. 4A is a circuit diagram illustrating the signal processing circuit 400, and FIG. 4B is a view illustrating an example of an amplifier 411-1 of an amplifying portion 410 of the signal processing circuit 400. The signal processing circuit 400 according to the fourth embodiment is configured as a differential circuit using the configuration in which the controlling portion 210 illustrated in FIG. 2 is added to the signal processing circuit 300 illustrated in FIG. 3.

The signal processing circuit 400 will be described below mainly based on the difference from the configuration when a single-phase circuit is configured as a differential circuit.

The signal processing circuit 400 illustrated in FIG. 4A has the amplifying portion 410 and a frequency converting circuit 420. The amplifying portion 410 has amplifiers 411-1 and 411-2.

The amplifier 411-1 receives an input of a differential signal (normal phase and reverse phase). FIG. 4B illustrates an example of the amplifier 411-1.

The amplifier 411-1 has a transistor M4-1 in which the gate terminal is inputted to an input terminal c-1, the drain terminal is connected to a terminal a through an inductance element L11, and the source terminal is connected to a terminal b. The amplifier 411-1 also has a transistor M4-2 in which the gate terminal is inputted to an input terminal c-2, the drain terminal is connected to the terminal a through an inductance element L12, and the source terminal is connected to the terminal b.

The terminal d-1 is connected between the inductance element L11 and transistor M4-1 through a capacitor C11. A terminal d-2 is connected between the inductance element L12 and transistor M4-2 through a capacitor C12. Further, the amplifier 411-1 has a resistance R1 having one terminal connected to the terminal c-1 and gate terminal of the transistor M4-1 and having the other end applied the bias voltage $V_{BIAS}$, and a resistance R2 having one end connected to the terminal c-2 and gate terminal of the transistor M4-2 and having the other terminal applied the bias voltage $V_{BIAS}$.

The amplifier 411-1 receives an input of differential signals from the input terminals c-1 and c-2. The normal phase signal of the differential signals is inputted to the input terminal c-1 and the reverse phase signal is inputted to the input terminal c-2. The transistor M4-1 amplifies the normal phase signal, and outputs a first normal phase amplified signal from the terminal d-1. The transistor M4-2 amplifies the reverse signal of input signals, and outputs the first reverse phase amplified signal from the terminal d-2. The first normal phase amplified signal and first reverse phase amplified signal are collectively referred to as "first amplified signal."

The configuration of the amplifier 411-2 is the same as the configuration of the amplifier 411-1. The amplifier 411-2 amplifies the inputted first amplified signal, and outputs the second normal phase amplified signal and second reverse phase amplified signal (hereinafter referred to as "second amplified signal").

The terminal b of the amplifier 411-1 is connected with each source terminal of the transistors M4-1 and M4-2, and is thereby ACwise grounded. The terminal a of the amplifier 411-2 is connected with the terminal b of the amplifier 411-1, and is thereby ACwise grounded.

Next, the configuration of the frequency converting circuit 420 will be described. The frequency converting circuit 420 has a voltage-current converter 424, an impedance element 421, a switching circuit 422, and the current-voltage converting circuit 123.

The voltage-current converter 424 has two transistors M1-1 and M1-2. The transistor M1-1 converts the second normal phase amplified signal into a current signal, and outputs a normal phase current signal. The transistor M1-2 converts the second reverse phase amplified signal into a current signal, and outputs a reverse phase current signal. The normal phase current signal and reverse phase current signal will be collectively referred to as "current signal."

The switching circuit 422 has four transistors M2-1, M2-2, M3-1, and M3-2.

The transistors M2-1 and M3-1 receive inputs of normal phase current signals from the source terminals, and receive inputs of normal phase local signals from the gate terminals. The transistors M2-2 and M3-2 receive inputs of reverse phase current signals from the source terminals, and receive inputs of reverse phase local signals from the gate terminals. The transistors M2-1 and M3-1 multiply normal phase current signals by normal phase local signals, and generate normal phase multiplied signals. The transistors M2-2 and M3-2 multiply reverse phase current signals by reverse phase local signals, and generate reverse phase multiplied signals. The normal phase multiplied signal and reverse phase multiplied signal will be collectively referred to as "multiplied signal."

The current-voltage converting circuit 123 converts the multiplied signal into the voltage to generate a multiplied voltage signal.

Figure 4C:
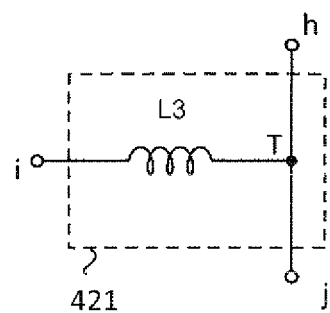
FIG. 4C is a view illustrating an example of an impedance element according to the fourth embodiment.

FIG. 4C illustrates an example of a circuit configuration of the impedance element 421. The impedance element 421 employs the same configuration as the impedance element 121 according to the first embodiment except that the capacitor C3 is not provided.

The impedance element 421 has an inductance element L3 having one end connected to the terminal i and having the other end connected to the terminal h and terminal j. The impedance element 421 directly connects the switching circuit 422 and voltage-current converting circuit 424, and connects the amplifying portion 410, switching circuit 422, and voltage-current converting circuit 424 through the inductance element L3. By this means, it is possible to provide both low AC and DC impedances between terminals h and j, and provide a high AC impedance and a low DC impedance between the terminals i and j. In addition, unlike the impedance element 121 described in the first embodiment, the impedance element 421 does not need to be provided with the capacitor C3 and ACwise grounded. This is because the amplifier 411-1 receives inputs of a normal phase signal and a reverse phase signal and therefore the terminal b where the normal phase signal and reverse phase signal cross is ACwise grounded.

The signal processing circuit 400 according to the present embodiment employs the same operation as in a case where the controlling portion 210 is applied to the configuration according to the third embodiment, except that a differential signal is used.

That is, the direct current $I_{mixer}$ used to drive the amplifying portion 411-1 is supplied to the voltage-current converter 424 through the impedance element 421. Further, the controlling portion 210 controls the potential of the connecting portion Q and the current flowing into the switching circuit 422 to adjust the rate to the current flowing in the voltage-current converter 424. Consequently, it is possible to drive all circuits according to a local signal of a low voltage without additional power consumption, and realize a signal processing circuit having good conversion gain and noise characteristics.

Further, it is also possible to use the direct current having been used to drive the amplifier 411-1 to drive the amplifier 411-2 of a later stage and, consequently, reduce power consumption.

In addition, in the present embodiment, although the configuration in which a controlling portion is applied to the signal processing circuit 300 illustrated in FIG. 3 is changed to a differential circuit, the signal processing circuit illustrated in FIGS. 1 to 3 may be configured as a differential circuit.

<Fifth Embodiment>

Figure 5:
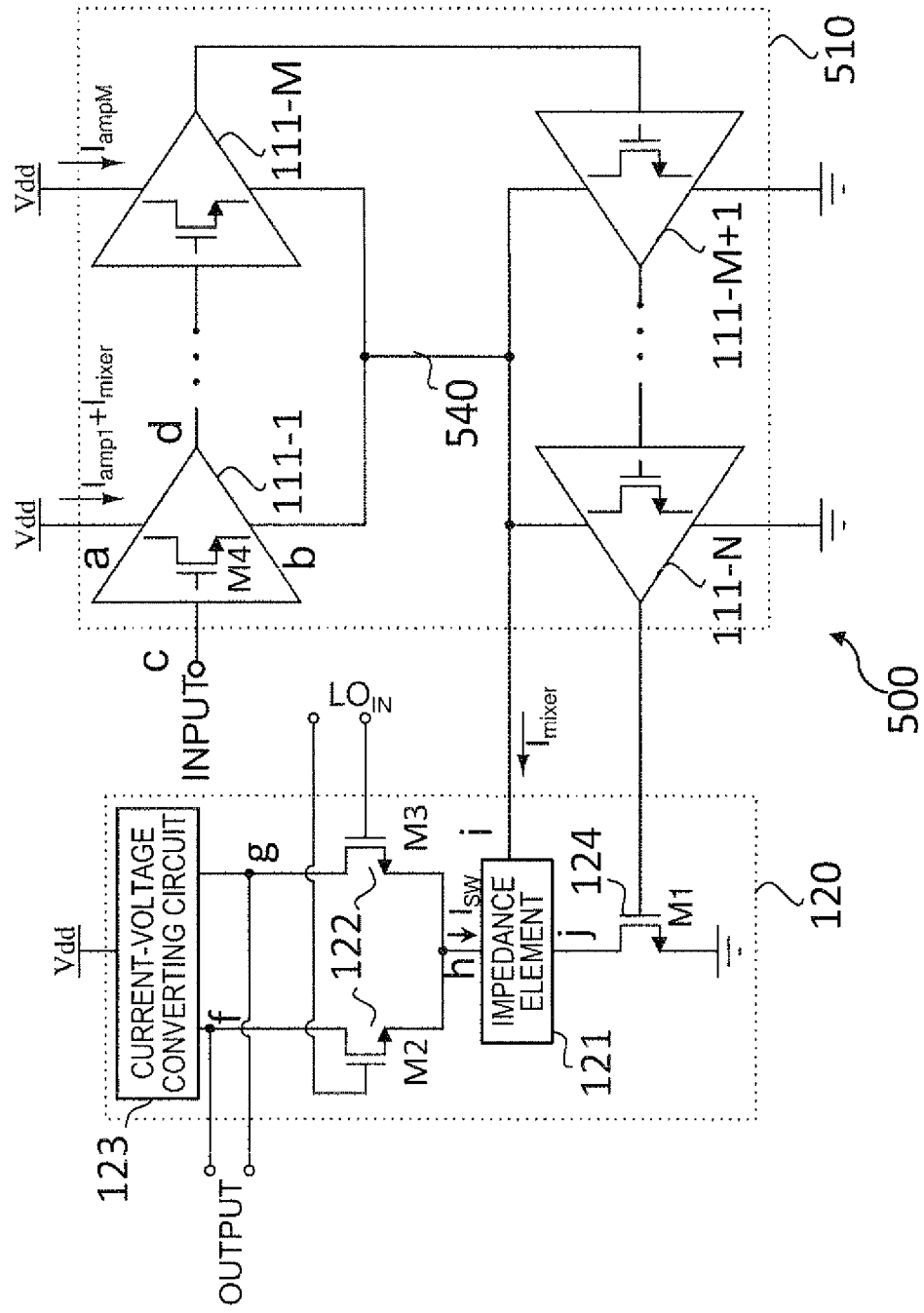
FIG. 5 is a view illustrating a signal processing circuit according to a fifth embodiment.

Next, a signal processing circuit 500 according to a fifth embodiment will be described. FIG. 5 is a view illustrating the signal processing circuit 500 according to the fifth embodiment.

The signal processing circuit 500 has an amplifying portion 510 and a frequency converting circuit 120. Unlike the signal processing circuit 100 according to the first embodiment, the amplifying portion 510 of the signal processing circuit 500 has N amplifiers 111-1 to 111-N (N is an integer of 3 or more). The other configurations are the same as those of the signal processing circuit 100 described in the first embodiment.

Each configuration of the amplifiers 111-1 to 111-N is the same as the configuration of the amplifier 111 described in the first embodiment.

The drain terminal of the kth (wherein k is an integer of 0<k<N) amplifier 111-k of the amplifiers 111-1 to 111-N is connected to the gate terminal of the (k+1)th amplifier 111-k+1, and the amplifier 111-k+1 amplifies the amplified signal amplified in the amplifier 111-k. In terms of the alternating current, the amplifiers 111-1 to 111-N are connected with each other in cascade.

The drain terminals of transistors provided in circuits of M amplifiers 111-1 to 111-M (M is an integer equal to or more than 2 and equal to or less than N) among the amplifiers 111-1 to 111-N are respectively connected to the first power source (Vdd). Further, the source terminals of the transistors of the amplifiers 111-1 to 111-M are connected with each other. Consequently, the transistors of the amplifiers 111-1 to 111-M are DCwise connected in parallel in terms of the direct current. The amplifiers 111-1 to 111-M will be referred to as "upper amplifying stage."

The drain terminals of transistors provided in circuits of N-M amplifiers 111-M+1 to 111-N (referred to as "lower amplifying stage") of the amplifiers 111-1 to 111-N are connected with each other. The source terminals of transistors in the lower amplifying stage are connected to the second power source potential (ground). Hence, the lower amplifying stage is DCwise connected in parallel in terms of the direct current. The drain terminals of transistors in the lower amplifying stage are commonly connected with source terminals of transistors in the upper amplifying stage, and therefore the upper amplifying stage and lower amplifying stage are DCwise connected in series in terms of the direct current signal.

Further, source terminals of transistors in the upper amplifying stage and drain terminals in the lower amplifying stage are connected to the voltage-current converter 124 through the impedance element 121 of the frequency converting circuit 120. In terms of the direct current signal, the voltage-current converter 124 is DCwise connected in series with the upper amplifying stage, and is DCwise connected in parallel with the lower amplifying stage.

In addition, as is clear from FIG. 5, the voltage-current converter 124 is also DCwise connected in series with the switching circuit 122 through the impedance element 121.

Hereinafter, currents flowing in the amplifying portion 510 will be described in terms of a direct current and alternating current, respectively. First, the flow of an alternating current signal will be described.

The amplifier 111-1 receives an input of an input signal which is an alternating current signal through the terminal c. The amplifier 111-1 amplifies the input signal, and generates a first amplified alternating current signal to output it from the terminal d. The first amplified alternating current signal is inputted to the terminal c of the amplifier 111-2. The amplifier 111-2 amplifies the first amplified alternating current signal, and generates the second amplified alternating current signal to output it from the terminal d. Then, the amplifiers 111-3 to 111-M also perform the same processing, and the amplifier 111-M generates an Mth amplified alternating current signal. The Mth amplified alternating current signal is inputted to the terminal c of the amplifier 111-M+1 in the lower stage. The amplifier 111-M+1 amplifies the Mth amplified alternating current signal, and generates a (M+1)th amplified alternating current signal to output it from the terminal d. The (M+1)th amplified alternating current signal is inputted to the terminal c of the amplifier 111-M+2. The amplifier 111-M+2 amplifies the (M+1)th amplified alternating current signal, and generates a (M+2)th amplified alternating current signal to output it from the terminal d. Then, the amplifiers 111-M+3 to 111-N also perform the same processing, and the amplifier 111-N generates an Nth amplified alternating current signal. The Nth amplified alternating current signal is inputted to the gate terminal of the transistor Ml of the voltage-current converter 124 of the frequency converter 120 as the output signal of the amplifying portion 510 (referred to as "amplified signal"). The subsequent flow of the alternating current signal is the same as that of the first embodiment, and therefore, description thereof will not be repeated.

Next, the flow of the direct current signal will be described. Assume that direct currents $I_{mixer}$, $I_{amp1}$, $I_{amp2}$, . . . and $I_{ampM}$ flow between drain terminals and source terminals of transistors in the upper amplifying stage. In this case, $I_{mixer}$+$I_{amp1}$+$I_{amp2}$+ . . . $I_{ampM}$ are outputted from the upper amplifying stage. Part of the current ($I_{mixer}$) of $I_{mixer}$+$I_{amp1}$+$I_{amp2}$+ . . . $I_{ampM}$ is supplied to the voltage-current converter 124, and the rest of the currents ($I_{amp1}$+$I_{amp2}$+ . . . $I_{ampM}$) flow between drain terminals and sources of transistors of 111-M+1 to 111-N in the lower amplifying stage.

Similar to the first embodiment, the total amount of the direct currents flowing into the switching circuit 122 is herein represented by $I_{SW}$. This direct current $I_{SW}$ is also inputted to the voltage-current converter 124 connected in series through the impedance element 121. Accordingly, the direct current $I_{SW}$+$I_{mixer}$ flows into the voltage-current converter 124.

With the signal processing circuit 500 and frequency converting circuit 120 according to the present embodiment, the direct current $I_{VI}$ flowing into the voltage-current converter 124 is greater, by an amount of the direct current $I_{mixer}$ inputted from the amplifying portion 510, than the direct current $I_{SW}$ flowing into the switching circuit 122. Consequently, it is possible to reduce noise produced in the switching circuit 122 while maintaining the linearity of the voltage-current converter 124, and decrease the amplitude of a local signal required to drive the switching circuit 122.

Further, the signal processing circuit 500 according to the present embodiment can also use the direct currents ($I_{amp1}$+$I_{amp2}$+ . . . $I_{ampM}$) having been used to drive amplifiers in the upper amplifying stage in order to drive amplifiers in the lower amplifying stage, and, consequently, reduce power consumption of the amplifying portion 510.

FIRST MODIFIED EXAMPLE

Figure 6:
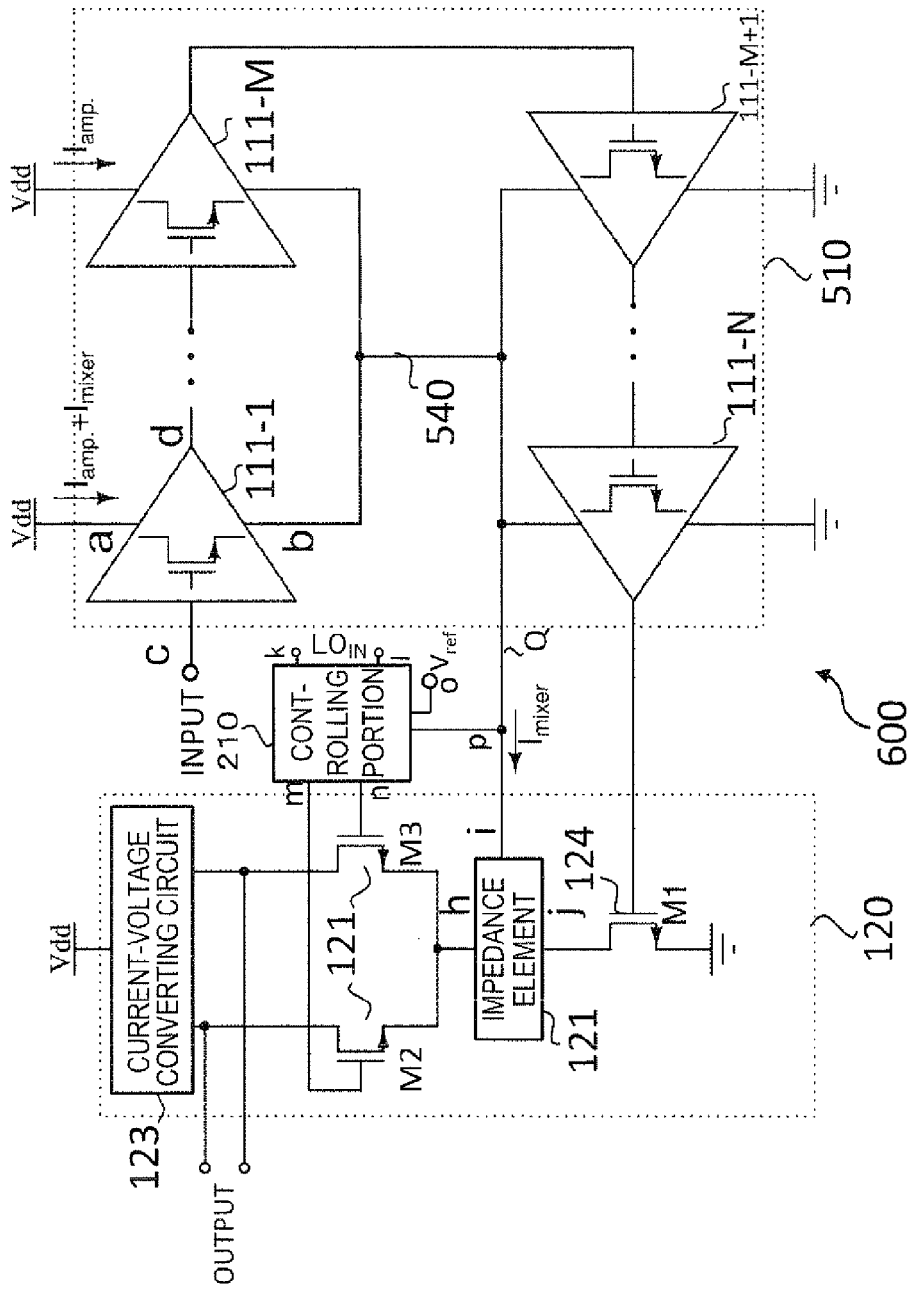
FIG. 6 is a view illustrating a signal processing circuit according to a first modified example of the fifth embodiment.

Next, a signal processing circuit 600 according to a first modified example of the fifth embodiment will be described. FIG. 6 is a circuit diagram of the signal processing circuit 600 according to the first modified example of the fifth embodiment. As illustrated in FIG. 6, the signal processing circuit 600 according to the first modified example differs from the signal processing circuit 500 according to the fifth embodiment in that the signal processing circuit 600 further has a controlling portion 210.

The configuration and function of the controlling portion 210 are the same as the configuration and function of the controlling portion 210 of the signal processing circuit 200 according to the second embodiment. However, the controlling portion 210 of the signal processing circuit 600 differs from the signal processing circuit 200 according to the second embodiment in the condition of the reference voltage $V_{ref}$ for determining the potential of the connecting portion Q. With the signal processing circuit 200 of the second embodiment, the condition of the reference voltage $V_{ref}$ is a potential required to cause the amplifier 111 to perform a desired operation. However, with the signal processing circuit 600, the reference voltage $V_{ref}$ is a potential required to cause the amplifiers 111-1 to 111-N to perform a desired operation.

To be more precise, with the signal processing circuit 200 according to the second embodiment, the potential of the connecting portion Q determines the potential of the source terminal of the transistor of the amplifier 111, however, with the signal processing circuit 600, the potential of the connecting portion Q determines potentials of source terminals of transistors of the amplifiers 111-1 to 111-M in the upper amplifying stage and determines potentials of drain terminals of transistors of amplifiers 111-M+1 to 111-N in the lower amplifying stage. Hence, the reference voltage $V_{ref}$ is set to such a voltage that the potential of the connecting portion Q is a potential of source terminals which allows transistors in the upper amplifying stage to perform a desired operation and a potential of the drain terminals which allows transistors in the lower amplifying stage to perform a desired operation.

SECOND MODIFIED EXAMPLE

Figure 7:
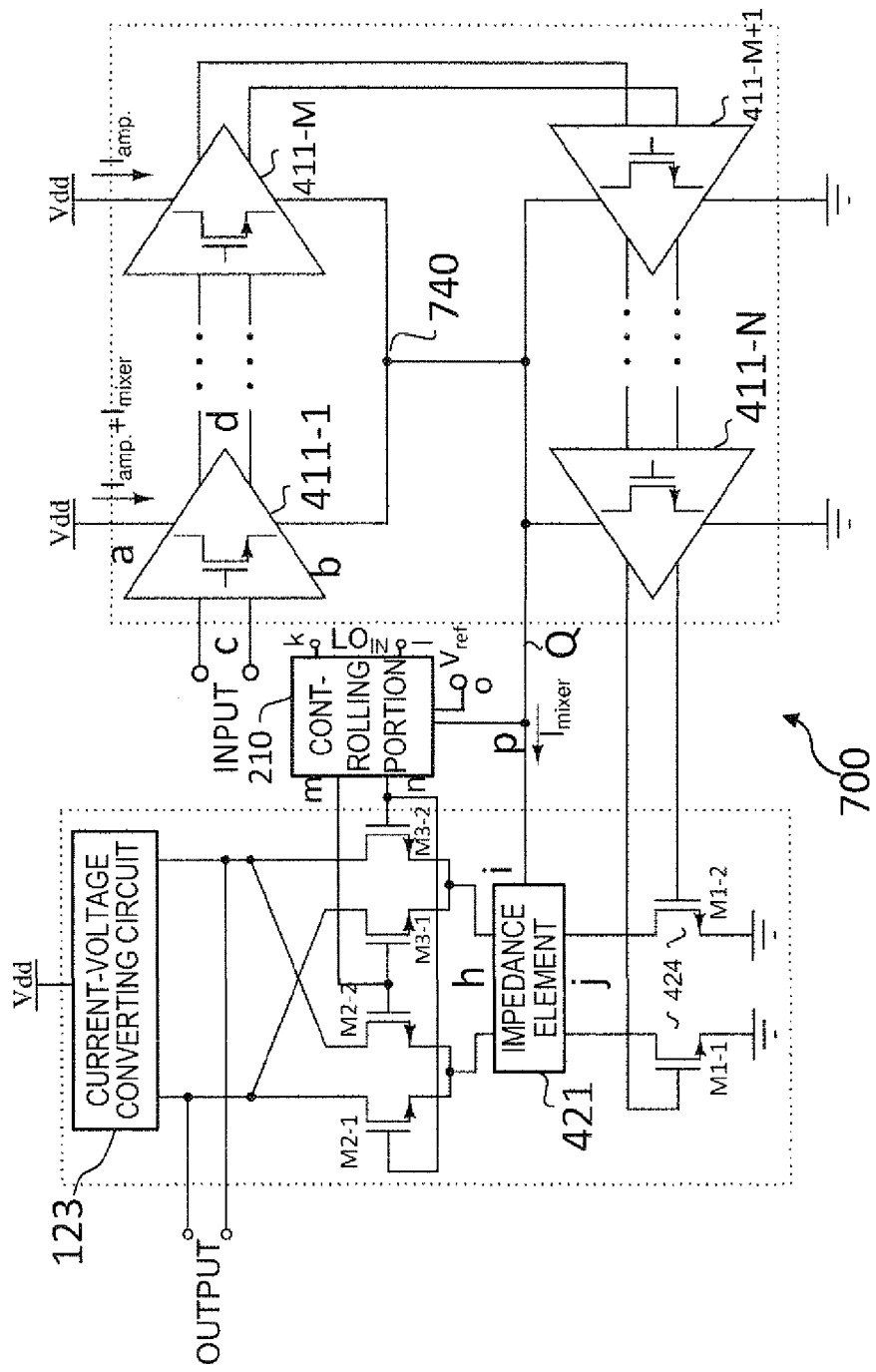
FIG. 7 is a view illustrating a signal processing circuit according to a second modified example of the fifth embodiment.

Next, a signal processing circuit 700 according to a second modified example of the fifth embodiment will be described. FIG. 7 is a circuit diagram of the signal processing circuit 700 according to the second modified example of the fifth embodiment. As illustrated in FIG. 7, the configuration of the signal processing circuit 600 according to the first embodiment is further configured as a differential circuit. The differential circuit has been described in the fourth embodiment, and therefore, description thereof will not be repeated. In addition, the signal processing circuit 700 employs the same configuration as the signal processing circuit described in the fourth embodiment except that amplifiers are N amplifiers 411-1 to 411-N.

THIRD MODIFIED EXAMPLE

Figure 8:
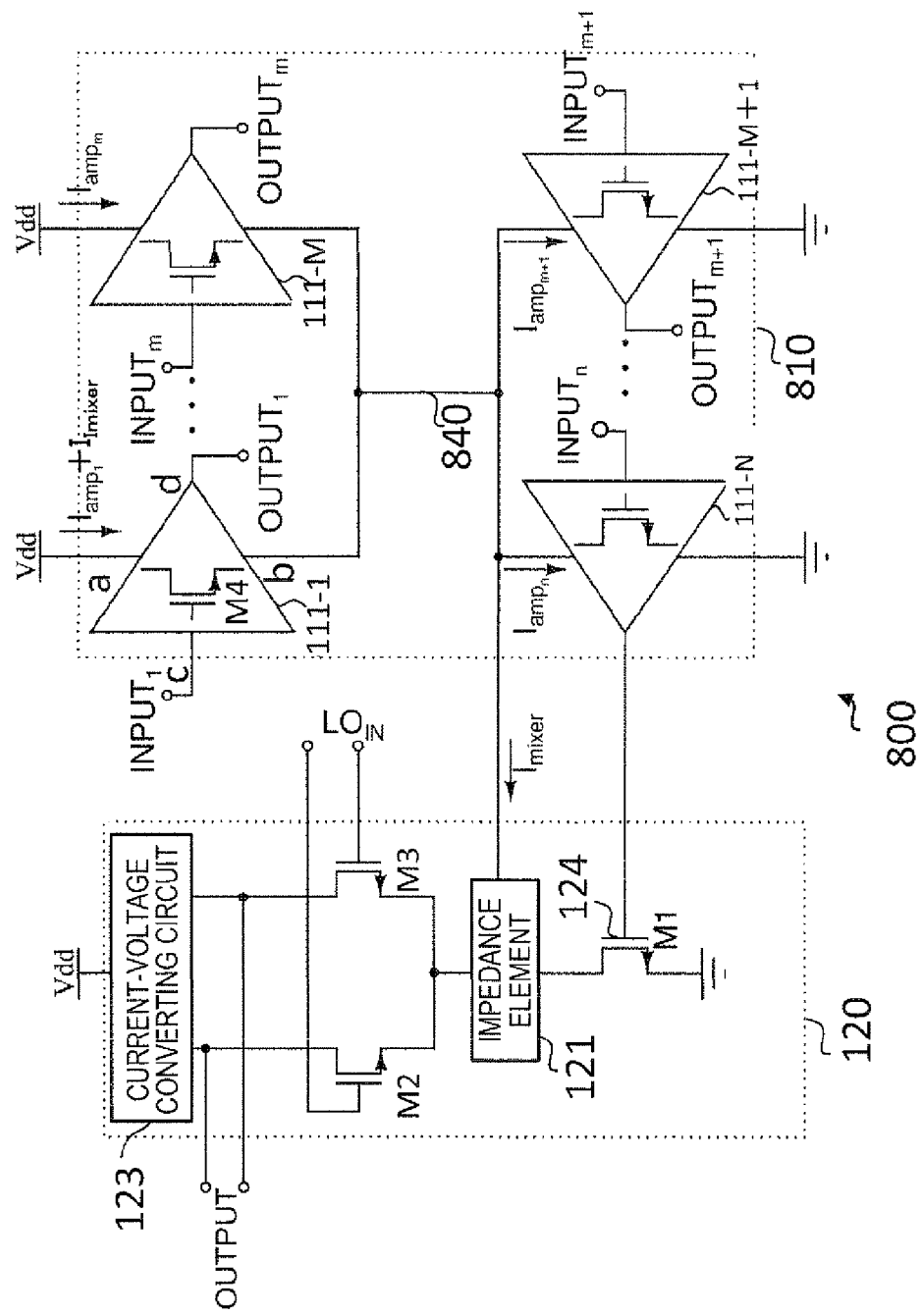
FIG. 8 is a view illustrating a signal processing circuit according to a third modified example of the fifth embodiment.

Next, a signal processing circuit 800 according to a third modified example of the fifth embodiment will be described. FIG. 8 is a circuit diagram of the signal processing circuit 800 according to the third modified example of the fifth embodiment.

Although, with the signal processing circuit 500 according to the fifth embodiment, the amplifying portion 510 has a plurality of amplifiers 111-1 to 111-N and a signal amplified by the kth amplifier is amplified by the (k+1)th amplifier, amplifiers 111-1 to 111-N of an amplifier 810 according to the present modified example receive inputs of different signals and amplify different signals.

That is, the drain terminal of the kth (wherein k is an integer of 0<k<N) amplifier 111-k of the amplifiers 111-1 to 111-N is not connected to the gate terminal of the (k+1)th amplifier 111-k+1. The other configurations are the same as those of the signal processing circuit 500.

Hereinafter, the flow of an alternating current signal of the amplifying portion 810 of the signal processing circuit 800 will be described. The alternating current signal flowing into the frequency converting circuit 120 and direct current signal flowing into the amplifying portion are the same as those in the signal processing circuit 500, and therefore, description thereof will not be repeated.

The amplifiers 111-1 to 111-N−1 respectively receive inputs of alternating current signals $INPUT_1$ to $INPUT_{n-1}$ from outside through the terminal c. The amplifiers 111-1 to 111-N+1 respectively amplify alternating current signals $INPUT_1$ to $INPUT_{n-1}$ and generate amplified alternating current signals $OUTPUT_1$ to $OUTPUT_{n-1}$. The amplifiers 111-1 to 111-N−1 respectively output the amplified alternating current signals $OUTPUT_1$ to $OUTPUT_n$ to outside through the terminal d.

With the example of FIG. 8, the amplifier 111-N amplifies the input signal $INPUT_N$ inputted from the terminal c, and generates an amplified signal. The amplifier 111-N outputs the amplified signal from the terminal d to the gate terminal of the transistor M1 of the voltage-current converter 124.

Although an example has been described with the above example where all amplifiers 111-1 to 111-N respectively amplify different signals, a configuration where some of amplifiers are connected in cascade and sequentially amplify input signals may be employed. That is, a configuration where the drain terminal of the kth (wherein k is an integer of 0<k<N) amplifier 111-k of some of the amplifiers 111-1 to 111-N is connected to the gate terminal of the (k+1)th amplifier 111-k+1.

Further, although a configuration has been described with the example in FIG. 8 where the amplified signal generated by the amplifier 111-N is inputted to the voltage-current converter 124, amplified alternating current signals generated by the other amplifiers 111-1 to 111-N−1 may be used as inputs of the voltage-current converter 124.

FOURTH MODIFIED EXAMPLE

Figure 9:
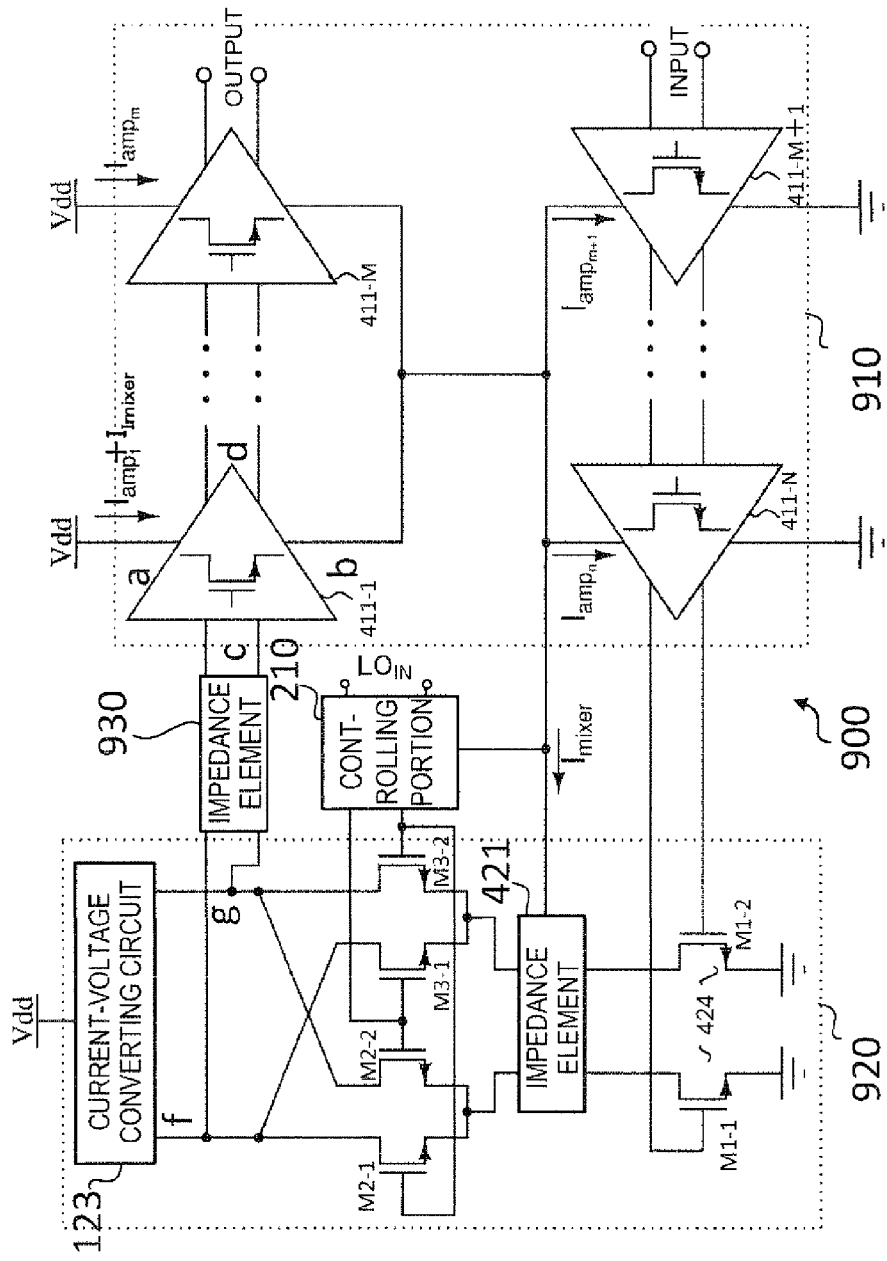
FIG. 9 is a view illustrating a signal processing circuit according to a fourth modified example of the fifth embodiment.

Next, a signal processing circuit 900 according to a fourth modified example of the fifth embodiment will be described using FIG. 9.

The signal processing circuit 900 differs from the signal processing circuit 500 in that the upper amplifying stage and lower amplifying stage are not connected in cascade in a case of the alternating current signal. Further, the signal processing circuit 900 differs from the signal processing circuit 500 according to the fifth embodiment in that the signal processing circuit 900 amplifies the input signal in the lower amplifying stage and amplifies, in the upper amplifying stage, the multiplied voltage signal which is an output of the frequency converting circuit 920. Hereinafter, these will be described in detail.

First, the configuration of an amplifying portion 910 will be described. With the amplifying portion 910, the upper amplifying stage and lower amplifying stage are not connected in cascade in the case of the alternating current signal. To be more specific, the drain terminal of the amplifier 111-M in the upper amplifying stage and the gate terminal of the amplifier 111-M+1 in the lower amplifying stage are not connected.

All amplifiers 111-1 to 111-M in the upper stage are connected in cascade. That is, the drain terminal of the kth (wherein k is an integer of 0<k<M) amplifier 111-k is connected to the gate terminal of the (k+1)th amplifier 111-k+1. Further, all amplifiers 111-M+1 to 111-N in the lower stage are connected in cascade. That is, the drain terminal of the kth (wherein k is an integer of M<k<N) amplifier 111-k is connected to the gate terminal of the (k+1)th amplifier 111-k+1.

Further, the terminal c of the amplifier 411-1 in the upper amplifying stage is connected to the terminals f and g of the current-voltage converting circuit 123 through an impedance element 930. Further, the terminal c of the amplifier 411-M+1 in the lower amplifying stage receives an input of an input signal. The terminal d of the amplifier 411-N in the lower amplifying stage is connected to the voltage-current converter 424.

Next, the flow of an alternating current signal will be described. The flow of the direct current is the same as that of the signal processing circuit 500, and therefore, description thereof will not be repeated.

The input signal is inputted through the terminal c of the amplifier 411-M+1 in the lower stage. The amplifier 411-M+1 to amplifier 411-N amplify the input signals, and output amplified signal from the terminal d of the amplifier 411-N. The amplified signal is outputted to the voltage-current converter 124. Next, the amplified signal is converted into a multiplied voltage signal by the frequency converting circuit 920. Subsequently, the multiplied voltage signal is inputted to the terminal c of the amplifier 411-1 in the upper stage through the impedance element 930. The amplifier 411-1 to amplifier 411-M in the upper stage amplify the multiplied voltage signals and output the amplified multiplied voltage signals from the terminal d of the amplifier 411-M. That is, the signal processing circuit 900 according to the fourth modified example employs a configuration where the amplifiers 411-M+1 to 411-N in the lower stage operate as an amplifying portion at a stage before the frequency converting circuit 920, and the amplifiers 411-1 to 411-M in the upper stage operate as an amplifying portion in the later stage.

In addition, a configuration may be employed where the amplifiers 411-1 to 411-M in the upper stage operate as the amplifying portion at the stage before the frequency converting circuit 920, and the amplifiers 411-M+1 to 411-N in the lower stage operate as an amplifying portion.

<Sixth Embodiment>

Figure 10:
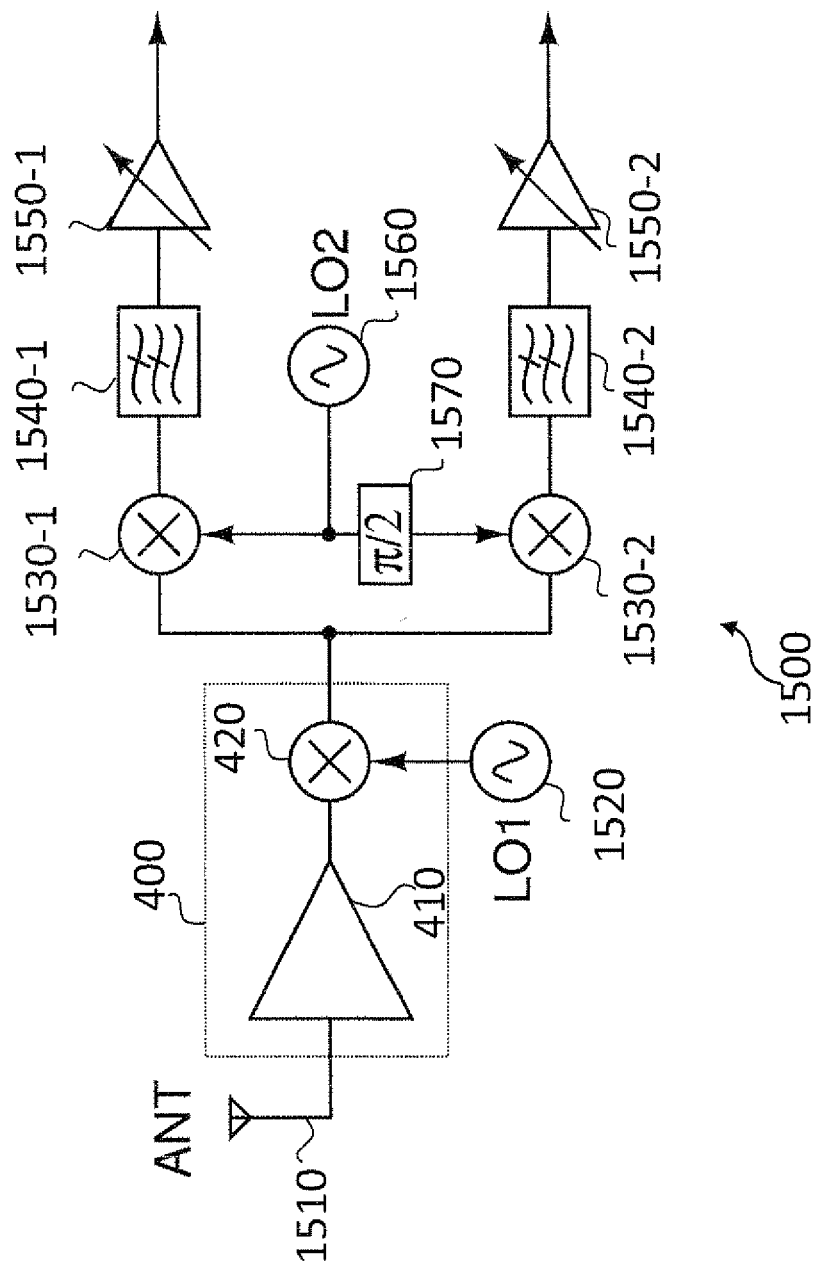
FIG. 10 is a view illustrating a receiver according to a sixth embodiment.

Next, a receiver 1500 according to a sixth embodiment will be described using FIG. 10.

The receiver 1500 according to the sixth embodiment uses a signal processing circuit 400 as a LNA (Low-Noise Amplifier) built-in mixer, and has an orthogonal demodulation function of the superheterodyne system.

The receiver 1500 has an antenna 1510 which receives a high frequency signal (input signal); a first local oscillator 1520 which generates a first local signal; the signal processing circuit 400 which amplifies an input signal, generates an amplified signal, and generates a multiplied voltage signal by multiplying the amplified signal by a first local signal; a second local oscillator 1560 which generates a second local oscillation signal; a phase shifter 1570 which generates a third local oscillation signal obtained by shifting the phase of the second local oscillation signal by 90 degrees; a mixer 1530-1 which multiplies the multiplied voltage signal by a second local signal and generates a first demodulated signal; a mixer 1530-2 which multiplies the multiplied voltage signal by a third local signal and generates a second demodulated signal; a lowpass filter 1540-1 which extracts a signal of a desired band from the first demodulated signal and generates a first extracted signal; a lowpass filter 1540-2 which extracts a signal of a desired band from the second demodulated signal, and generates a second extracted signal; a variable gain amplifier 1550-1 which amplifies the first extracted signal and generates a first output signal; and a variable gain amplifier 1550-2 which amplifies the second extracted signal and generates a second output signal. The first output signal and second output signal are outputted to a signal processing portion which is not illustrated. The signal processing portion performs signal processing such as A/D conversion of the output signals.

As illustrated in FIG. 4, the signal processing circuit 400 employs a configuration including the amplifying portion 410 which amplifies an input signal and generates an amplified signal, and a frequency converting circuit 420 which generates a multiplied voltage signal from the amplified signal.

The receiver 1500 according to the present embodiment can realize a mixer which can be driven by a local signal of a low voltage without additional power consumption, using the signal processing circuit 400 as the LNA (Low-Noise Amplifier) build-in mixer, and provide good conversion gain and noise characteristics.

Although the receiver 1500 employs the configuration using the signal processing circuit 400 with the present embodiment, any one of the signal processing circuits 100 to 900 may be used.

Further, although the receiver 1500 has an orthogonal demodulation function of the superheterodyne system with the present embodiment, the configuration of the receiver is not limited to this.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and sprit of the inventions.

What is claimed is:

1. A frequency converting circuit which generates a multiplied signal obtained by multiplying a local signal by an amplified signal generated by an amplifying portion comprising a first transistor having a drain terminal connected to a first power source potential, the frequency converting circuit comprising:

a converter which comprises at least one second transistor having a gate terminal connected to the amplifying portion and which converts the amplified signal inputted to the gate terminal into a current signal;

a switching circuit which comprises at least two third transistors whose source terminals are connected to each other and which multiplies the current signal by the local signal and generates the multiplied signal; and an impedance element which comprises a first terminal connected to a source terminal of the first transistor, a second terminal connected to a drain terminal of the at least one second transistor and a third terminal connected to the source terminals of the at least two third transistors, which supplies a first direct current from the source terminal of the first transistor and a second direct current from the source terminals of the at least two third transistors to the drain terminal of the at least one second transistor, wherein impedance of the impedance element comprises a high AC impedance between the first terminal and the second terminal.

2. The frequency converting circuit according to claim 1, further comprising a controlling portion which controls the second direct current such that a first potential of a connecting portion between the amplifying portion and the first terminal of the impedance element becomes a desired potential.

3. The frequency converting circuit according to claim 1, further comprising a controlling portion which compares a first potential of a connecting portion between the amplifying portion and the first terminal of the impedance element with a reference voltage, and supplies a voltage to the third transistors such that the first potential matches the reference voltage.

4. The frequency converting circuit according to claim 1, wherein:

the amplified signal comprises a normal phase amplified signal and a reverse phase amplified signal;

the at least one second transistor of the converter comprises:

a normal phase second transistor which generates a normal phase current signal from the normal phase amplified signal; and a reverse phase second transistor which generates a reverse phase current signal from the reverse phase amplified signal, and wherein the current signal comprises the normal phase current signal and the reverse phase current signal; and the switching circuit comprises: two normal-phase third transistors which generate normal phase multiplied signals from the normal phase current signal and which are connected in parallel; and two reverse-phase third transistors which generate reverse phase multiplied signals from the reverse phase current signal and which are connected in parallel, and wherein the multiplied signal comprises the normal phase multiplied signal and the reverse phase multiplied signal.

5. A receiver comprising:
an antenna which receives an input signal;
an amplifying portion which amplifies the input signal and generates an amplified signal; and
a frequency converting circuit according to claim 1 which multiplies the amplified signal by a local signal and generates a multiplied signal.

6. A signal processing circuit comprising:
an amplifying portion for generating an amplified signal, the amplifying portion comprising: M (where M is an integer equal to or more than 2 and equal to or less than N) amplifiers which each comprise a first transistor, source terminals of the respective first transistors being connected together and drain terminals of the respective first transistors being connected to a first power source potential; and N-M (N is an integer equal to or more than 3) amplifiers which each comprise a second transistor, drain terminals of each of the respective second transistors being connected to the connected-together source terminals of the first transistors and source terminals of the respective second transistors being connected to a second power source potential;
a converter which comprises at least one third transistor having a gate terminal connected to the amplifying portion and which converts the amplified signal supplied to the gate terminal;
a switching circuit which comprises at least two fourth transistors whose source terminals are connected to each other and which multiplies the current signal by the local signal and generates a multiplied signal; and
an impedance element which comprises a first terminal connected to the connected-together source terminals of the first transistors, a second terminal connected to a drain terminal of the at least one third transistor and a third terminal connected to the connected-together source terminals of the at least two fourth transistors, which supplies a first direct current from the connected-together source terminals of the first transistors and a second direct current from the connected-together source terminals of the fourth transistors to the drain terminal of the at least one third transistor, wherein impedance of the impedance element comprises a high AC impedance between the first terminal and the second terminal.

7. The signal processing circuit according to claim 6, wherein a drain terminal of a kth (k is an integer of 0<k<N) transistor of the first and second transistors of the amplifying portion is connected to a gate terminal of a (k+1)th transistor of the first and second transistors; and the (k+1)th amplifier amplifies an amplified alternating current signal amplified by the kth amplifier.

8. A receiver comprising:
an antenna which receives an input signal; and
the signal processing circuit according to claim 6.

9. A frequency converting circuit comprising:
an amplifying portion which amplifies an input signal;
a converter which converts an amplified signal, which is amplified by the amplifying portion, into a current signal;
an impedance element which connects the amplifying portion and the converter with a high AC impedance and which supplies to the converter a direct current from the amplifying portion; and
a switching circuit which comprises a pair of transistors connected in parallel, which is connected with the converter through the impedance element, and which generates a multiplied signal by multiplying a local signal by the current signal.

10. The frequency converting circuit according to claim 9, wherein the amplifying portion comprises a transistor having a drain terminal connected to a first power source.

11. The frequency converting circuit according to claim 9, wherein the amplifying portion comprises two or more amplifiers connected in cascade.

12. The frequency converting circuit according to claim 11, wherein the amplifying portion, the switching circuit, and the converter are operable in normal and reverse phases.

13. The frequency converting circuit according to claim 10, wherein:
the amplifying portion comprises a plurality of cascade-connected first amplifiers which are connected to a first power source potential, and a plurality of cascade-connected second amplifiers which are connected to a second power source potential; and
transistors comprising the plurality of first amplifiers have drain terminals connected to the first power source potential and have source terminals commonly connected, and transistors comprising the plurality of second amplifiers have drain terminals commonly connected and have source terminals connected to the second power source potential.

14. A receiver comprising:
an antenna which receives an input signal;
the frequency converting circuit according to claim 12.

* * * * *